United States Patent [19]

Steinmetz, Jr.

[11] Patent Number: 5,600,579

[45] Date of Patent: Feb. 4, 1997

[54] HARDWARE SIMULATION AND DESIGN VERIFICATION SYSTEM AND METHOD

[75] Inventor: William C. Steinmetz, Jr., San Jose, Calif.

[73] Assignee: Apple Computer, Inc., Cupertino, Calif.

[21] Appl. No.: 271,987

[22] Filed: Jul. 8, 1994

[51] Int. Cl.$^6$ ............................. G06F 9/455; G06F 13/14
[52] U.S. Cl. ......................... 364/578; 364/149; 364/150; 395/500
[58] Field of Search ...................................... 364/488, 489, 364/490, 491, 578, 200, 148, 149, 150, 151; 395/500, 700

[56] References Cited

U.S. PATENT DOCUMENTS

| | | | |
|---|---|---|---|
| 5,060,140 | 10/1991 | Brown et al. | 364/200 |
| 5,163,016 | 11/1992 | Har'El et al. | 364/578 |
| 5,321,828 | 6/1994 | Phillips et al. | 395/500 |
| 5,325,309 | 6/1994 | Halaviati et al. | 364/488 |
| 5,377,122 | 12/1994 | Werner et al. | 364/488 |
| 5,410,681 | 4/1995 | Jessen et al. | 395/500 |
| 5,426,770 | 6/1995 | Nuber | 395/500 |
| 5,475,843 | 12/1995 | Halaviatti et al. | 395/700 |
| 5,493,507 | 2/1996 | Shinde et al. | 364/489 |
| 5,493,672 | 2/1996 | Lau et al. | 395/500 |

FOREIGN PATENT DOCUMENTS

0508619A3  10/1992  European Pat. Off. .

OTHER PUBLICATIONS

"A Layered Architecture for Simulating Dustributed Operating Systems'", by J. Rodrigo and G. Leon, Software Engineering for Real Time Systems, IEE Conf. Pub. 309, 1989, pp. 151–154.

"An Intergrated CAD Environment for System Design", by J. Pendelton and C. Burns, System Sciences, 1989 Annual Hawaii Int'l Conference, vol. 1, pp. 39–48.

D. Becker et al., "An Engineering Environment for Hardware/Software Co–Simulation", *29th ACM/IEEE Design Automation Conference*, pp. 129–134, published Jun. 8, 1992, Anaheim California.

*Primary Examiner*—Kevin J. Teska
*Assistant Examiner*—Russell W. Frejd
*Attorney, Agent, or Firm*—Burns, Doane, Swecker & Mathis, L.L.P.

[57] ABSTRACT

A hardware design verification system has a hardware simulator, a test script, and a dispatcher, each preferably running as concurrent processes on a computer. The test script language is independent of the hardware simulator language. The hardware simulator simulates a hardware environment having a circuit under test coupled to a master model. To manipulate the hardware environment, the test script transmits a first packet to the dispatcher, the first packet being encoded in accordance with a predetermined encryption technique and designating a desired manipulation of the simulated hardware environment. The dispatcher, in response to receipt of the first packet, transmits the first packet to the master model, which in response decodes the first packet in accordance with the predetermined encryption technique and manipulates the hardware environment in accordance with the desired manipulation. In a preferred embodiment, the hardware simulator, dispatcher, and test script each rely on operating system facilities for packet transmission. For example, where the operating system is the UNIX system, one UNIX socket is dedicated for packet transmission between the test script and the dispatcher, and a second UNIX socket is dedicated to packet transmission between the hardware simulator and the dispatcher. When a desired hardware environment manipulation includes detecting the value of a signal in the circuit under test, the master model uses the predetermined encryption technique to encode the detected value into a packet. The packet is transmitted to the dispatcher, which forwards the packet to the test script.

22 Claims, 3 Drawing Sheets

HARDWARE SIMULATION AND DESIGN VERIFICATION SYSTEM AND METHOD

BACKGROUND

The present invention relates to verification of electronic hardware designs, and more particularly to a system and method in which an electronic hardware simulator is driven by a user-written test script.

Before any piece of complicated electronic equipment is actually constructed from a new design, it is desirable to verify that the design is correct, that is, to confirm that the design will result in equipment that operates in accordance with predetermined functional specifications. For this purpose, hardware simulators, in the form of computer programs such as Verilog, are known.

In performing design verification, it is frequently necessary to simulate not only the newly designed hardware, but also enough of the surrounding electronic environment to provide suitable interface signals to the circuit under test. For this purpose, the engineer creates or obtains a model of a "master" device (henceforth referred to as a "master model") that can, by way of instructions, manipulate the simulation environment in a desired fashion and produce deterministic results. For example, in order to test a memory chip, an engineer requires a master model to generate functionally and correctly timed read and write control signals to the chip within the simulation environment. The constraints imposed by the instruction set of the master model limit the extent of verification.

Currently, in the Verilog simulation environment and depending on the master model, such instructions take one of four forms: 1) a master model's native assembly language, 2) Verilog Hardware Description Language (HDL), 3) Programming Control Language (PCL) (a language for use with Verilog models of widely used integrated circuits, the models being commercially available from a company called Logic Modeling Corporation), or 4) a user created language using a combination of HDL and Verilog's Programming Language Interface (PLI). The use of these languages will now be briefly described.

If the master model (implemented either in HDL or as a gate level model) emulates a real central processing unit (CPU) to the extent that the modeled CPU not only generates functionally and correctly timed control signals but also executes binary compatible instructions, then the modeled CPU executes those instructions directly from an emulated memory device (also within the simulation environment). These instructions are in the form of the CPU's native assembly language. Consequently, testing a modeled circuit under these circumstances requires, first, that a test scenario be written using the instructions of the "master model" that interfaces with the modeled circuit under test. These instructions must then be assembled into binary object code, and the binary code loaded into memory. Finally, the master model is given a pointer to the loaded instructions and directed to begin execution.

The above-described use of assembly language offers the most realistic simulation. It acts as real code in a real environment, and has the same drawbacks with respect to verification goals. That is, the use of assembly language to control a modeled CPU that interacts with the modeled circuit under test can only control certain aspects of the CPU, such as memory and register operations; it cannot directly manipulate Verilog wires, registers, and time. Furthermore, assembly language is a low level language that typically requires many instructions to perform a single task. In view of the above, an engineer will have a difficult time coding, reading, and debugging assembly language test code.

If the master model is coded in the Verilog HDL language, then the master model may alternatively forego emulation of a real instruction execution cycle, and instead operate (i.e., generate interface signals) in accordance with a list of HDL commands. In effect, this form of master model is just a group of function calls. The functions perform single tasks such as reading data from memory.

HDL is the native language of Verilog and has complete control over the simulation. It can easily manipulate wires, registers, and time. However, HDL offers a limited command set. It does not support string handling, which is useful for generating error, warning, and descriptive messages, and is also needed to parse a command line (presently, command line arguments are accessible only from within the PLI interface). Furthermore, HDL has poor flow control directives. Finally, it does not support the use of data structures and pointers that would otherwise facilitate the emulation of hardware such as first-in-first-out buffers.

A Logic Modeling CPU master reads instructions written in PCL, a language that is similar to the well-known C programming language. PCL includes a subset of C instructions and also provides CPU model specific instructions, such as read() and write() to perform memory reads and writes. The language is easier to use than assembly language but still does not allow direct manipulation of Verilog wires, registers, and time. It also lacks string handling, powerful flow control directives, and data structure support.

Finally, using a combination of HDL and Verilog's PLI, the engineer can implement a master model to read a custom-designed simulation language. The language can include any type of instruction devised by the engineer, including those that manipulate Verilog wires, registers, and time. One problem with this approach is that a lot of time is required in order to implement and debug an entire language. Furthermore, the custom-designed language will not be compatible with existing industry standard languages.

In the ideal case, the instructions of a simulation test language will support both bus transactions and "back-door" instructions. Back-door instructions are those that execute transactions in zero simulation time. For example, it may be desired to verify the contents of memory after a direct memory access cycle has been performed by a simulated I/O device. Instead of consuming many bus cycles to read back each data element from the memory (a pointless exercise, since it is not the memory read function that is being tested), a zero simulation time instruction can accomplish this task to efficiently make use of real time.

For the most part, all of the above-described languages support bus transaction instructions. However, most languages do not support back-door instructions.

It has been seen that four types of languages for encoding tests exist. Each language pairs a unique instruction language with a corresponding Verilog master model. Although each of the languages offers some advantages, each is also encumbered with strong disadvantages. No one of the above methods provides a language that has a large command set, allows manipulation of every part of the Verilog environment, is easy to code and debug, and is compatible with other industry software.

SUMMARY

It is therefore an object of the present invention to provide a method of hardware design verification that provides flexibility, simulation control, and a large array of command control capabilities.

In accordance with one aspect of the present invention, the foregoing and other objects are achieved in a hardware design verification system comprising simulator means, test script means, and dispatch means. The simulator means simulates a hardware environment having a circuit under test coupled to a master model. The test script means executes a test script. The test script means uses first means to transmit a first packet to the dispatch means, the first packet being encoded in accordance with a predetermined encryption technique and designating a desired manipulation of the simulated hardware environment. The dispatch means, in response to receipt of the first packet, uses the second means to transmit the first packet to the master model. The master model, in response to receipt of the first packet, decodes the first packet in accordance with the predetermined encryption technique and manipulates the hardware environment in accordance with the desired manipulation.

In accordance with another aspect of the invention, each of the simulator means, test script means, and dispatch means is an executing computer program under control of an operating system that provides for concurrent execution of computer programs. In a preferred embodiment, the operating system is a UNIX operating system, and the first and second means are UNIX sockets. In such an operating system, the simulator means and test script means are preferably forked off as child processes from the dispatch means, which is a parent process.

In accordance with yet another aspect of the invention, the predetermined encryption technique includes converting an integer into a character string. This feature enhances portability of the inventive verification system, since there is no one standard that specifies the order in which bytes of a multi-byte long integer are stored.

In accordance with yet another aspect of the invention, the first means is further capable of transmitting a packet from the dispatch means to the test script means, and the second means is further capable of transmitting a packet from the simulator means to the dispatch means. Furthermore, when the desired manipulation includes detecting a signal value in the circuit under test, the master model, after detecting the signal value, uses the predetermined encryption technique to include the detected signal value in a second packet and uses the second means to transmit the second packet to the dispatch means. The dispatch means, in response to receipt of the second packet, uses the first means to transmit the second packet to the test script means. The test script means, in response to receipt of the second packet, decodes the second packet in accordance with the predetermined encryption technique. With this feature, the test script means may compare the detected signal value with an expected signal value in order to detect errors in the operation of the circuit under test.

In accordance with still another aspect of the invention, the dispatch means mediates concurrent streams of packets between the test script means and the simulator means, by maintaining a correspondence between packet streams associated the test script means and packet streams associated with the simulator means.

In accordance with yet another aspect of the invention, the test script means and the master model are made by using a first programming language to generate a test script computer program comprising invocations of at least one of a plurality of predefined verification system functions, and using a second programming language to generate a master model computer program comprising invocations of at least one of the plurality of predefined verification system functions. The test script computer program is compiled to produce the test script. The compilation process includes accessing a shared library of functions to retrieve object code corresponding to the at least one of the plurality of predefined verification system functions invoked by the test script computer program. The master model computer program is compiled to produce the master model. The compilation process includes accessing the shared library of functions to retrieve object code corresponding to the at least one of the plurality of predefined verification system functions invoked by the master model computer program.

In accordance with still another aspect of the invention, the first programming language is not the same as the second programming language.

In yet another aspect of the invention, the at least one of the plurality of predefined verification system functions invoked by the test program computer program includes a first verification system function; and the at least one of the plurality of predefined verification system functions invoked by the master model computer program includes the first verification system function. Thus, the test script means and the master model may each include object code from a common library of functions, even though the test script and master model computer programs may be written in different programming languages.

In an alternative embodiment, the master model is a computer program that is interpreted by the hardware simulator. Thus, in accordance with yet another aspect of the invention, the test script means and the master model are made by using a first programming language to generate a test script computer program comprising invocations of at least one of a plurality of predefined verification system functions, and using a second programming language to generate a master model computer program comprising invocations of at least one of the plurality of predefined verification system functions. The test script computer program is then compiled to produce the test script, wherein the step of compiling the test script computer program includes accessing a shared library of functions to retrieve object code corresponding to the at least one of the plurality of predefined verification system functions invoked by the test script computer program. A hardware simulator computer program is also compiled to produce the hardware simulator, wherein the step of compiling the hardware simulator computer program includes accessing the shared library of functions to retrieve object code corresponding to the at least one of the plurality of predefined verification system functions invoked by the master model computer program.

BRIEF DESCRIPTION OF THE DRAWINGS

The objects and advantages of the invention will be understood by reading the following detailed description in conjunction with the drawings in which.

DETAILED DESCRIPTION

Overview

Figure 1:
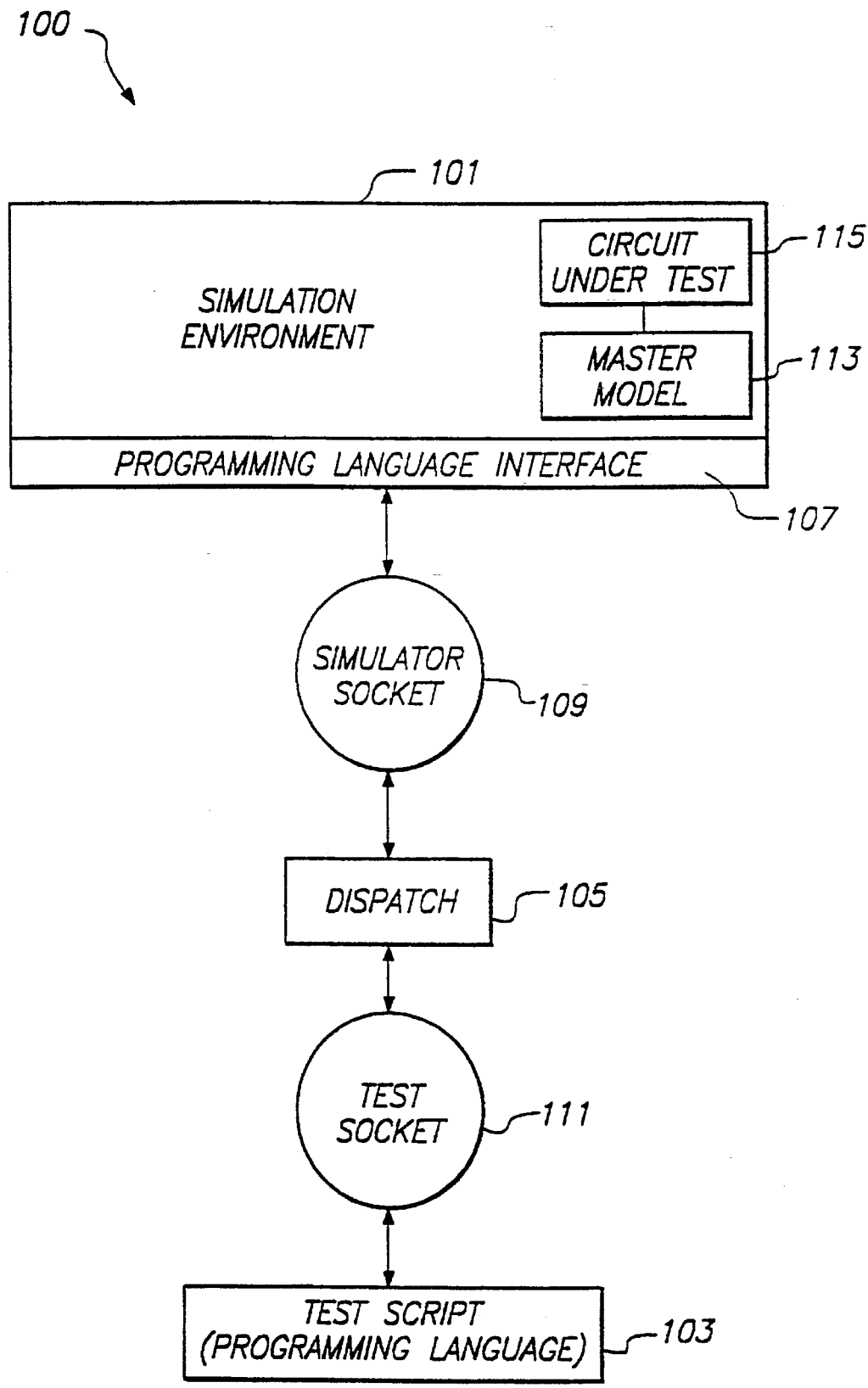
FIG. 1 is a block diagram of a preferred embodiment of the inventive hardware design verification system.

FIG. 1 is a block diagram of a preferred embodiment of the inventive hardware design verification system 100. The verification system 100 comprises a number of program modules (described below) which execute concurrently on a time sharing operating system, which is preferably the well-known UNIX system. The UNIX features that are utilized in the preferred embodiment that is described below are well known in the art, and are described, for example, in the book by David A. Curry entitled "Using C on the UNIX System", published by O'Reilly & Associates in 1989, 1990, and 1991. The text of the February 1991 printing of this book is hereby incorporated by reference. In particular, pages 100–105 of this book describe how a parent process can create and execute child processes, and pages 125–134 describe the "socket" method of interprocess communication that is utilized in the present invention.

Alternatively, other operating systems may be used, so long as they support multitasking and means for inter-task communication.

Any computer that is capable of running a suitable operating system may be used, with those having a fast CPU and a great deal of memory being preferable.

One of the program modules in the verification system 100 is a simulation environment 101. The simulation environment 101 provides all of the resources necessary for modeling the operation of a circuit under test (CUT) 115 as well as the operation of a master model 113 that, in the simulation environment, is coupled to the CUT 115. The simulation environment 101 is preferably a Verilog simulator, which is commercially available from Cadence Design Systems, Inc., located in San Jose, Calif. To be suitable for use in the verification system 100, the simulation environment 101 must include means for allowing the user to add new commands to the language. Verilog provides this mechanism with its Programming language Interface (PLI) 107, which provides the capability for a user to link C object code with the Verilog code.

The verification system 100 also includes a test script 103 that is designed to test particular features of the CUT. In accordance with the invention, the programming language in which the test script 103 is written should offer many flow control directives, have low level computer control as well as high level language constructs, and have strong industry support. In a preferred embodiment of the invention, the C programming language is used for writing the test script 103. An advantage in this selection is the fact that C is the native language used by the Verilog simulation environment.

A dispatch module 105 is at the heart of the verification system 100. Its purpose is to bridge the executing test script 103 and the simulation environment 101. It does this by forking off the C-based test script 103 as well as the simulation environment 101. (As used throughout this disclosure, the term "fork" refers to any operation comparable to the UNIX fork system call, in which a running program, the "parent process", creates and begins the execution of a "child process" which then runs independently of the parent.) The dispatch module 105 maintains a communications link with the simulation environment 101 by means of a simulator socket 109, and with the test script 103 by means of a test socket 111. (Each of the sockets 109, 111 is a UNIX node that allows bidirectional communication between two independent processes. UNIX sockets are well known in the art, and are not described here in further detail.) Once both the simulation environment 101 and the test script 103 are running, the dispatch module 105 mediates packet transactions between them. Transaction packets (described in more detail below) flow from the test script 103 through the dispatch module 105 to the simulation environment 101 and back. A transaction packet sent by the test script 103 to the simulation environment 101 is encoded to cause the master model 113 within the simulation environment to perform desired actions. These actions are designed by the circuit designer and/or the verification engineer to affect the CUT 115 in a particular way. A transaction packet sent by the simulation environment 101 back to the test script 103 reports the status and/or results of the requested action.

The following text describes the packet flow for a single test. A running test script 103 communicates with the master model 113 (i.e., the simulated task-initiating component such as a CPU) being simulated in the simulation environment 101 by sending a data packet to the dispatch module 105 by means of the test socket 111. The dispatch module 105, in turn, forwards the packet, by means of the simulator socket 109, to the waiting master model 113 in the simulation environment 101. The master model 113 decodes the data packet and acts upon its instructions. After performing the requested task, the master model 113 sends a reply packet back across the simulator socket 109 to the dispatch module 105. The dispatch module 105 then forwards the reply packet across the test socket 111 to the originating test script 103. The above-described cycle of packet transfers continues until the test ends.

The intended function of, as well as the number and types of arguments contained within each transaction packet is defined by the user. However, the method of encoding the packets is defined by the verification system 100. In accordance with one aspect of the invention, each transaction packet consists of a command word followed by an array of string argument elements. The command word (described in more detail below, with reference to FIG. 2) contains a user encoded instruction operation code ("op code"), a user encoded argument element count, and special dispatch codes to denote the end of test, etc. The argument elements that follow the command word can represent both numbers and ASCII text. As an example, a test script 103 might send a packet containing a write command word followed by three arguments. The command word in this example contains a write op code and an argument element count of three. The first argument contains the size of the data to be written (e.g., byte, word, etc.); the second argument contains the write address; and the third argument contains the write data. With the correct packet encoding by the test and the right packet decoding by the master model 113, the packet structure allows for an almost infinite number of instruction types.

Just as a single test script 103 can connect to the test socket 111 and send and receive packets, many test scripts 103 can connect to the test socket 111 and send and receive packets. This behavior is possible because sockets can maintain multiple simultaneous connections. This fact means that multiple tests can simultaneously communicate with the simulation environment 115. The simultaneous transactions may be used, for example, to weed out interlock problems, and the like.

The Dispatch Module 105

As described above, the dispatch module 105 bridges one or more test scripts 103 with the simulation environment 101. The operation of the dispatch module will now be described in more detail.

Upon startup, the dispatch module 105 creates two sockets using unique, random names. One socket (the test socket 111) connects the test scripts 103 with the dispatch module 105. The second socket (the simulator socket 109) connects the simulation environment 101 with the dispatch module 105. In the preferred embodiment of the invention, in which all programming modules are run under the UNIX system, the sockets appear as files under a directory. Other processes can connect to the socket by connecting to the file name. Since the dispatch module 105 creates the sockets and is responsible for satisfying requests received in transaction packets by means of the sockets, it acts as the server process. Accordingly, the simulation environment 101 and test scripts 103 behave as client processes. In the UNIX environment, after a client process successfully connects to a named socket, the socket notifies the server process of the connection. After establishing connection, the server and client processes can read and write to each other as if they were reading and writing from a file.

Next, the dispatch module 105 forks off a process for the simulation environment 101. During invocation of the simulation environment 101, the dispatch module 105 passes a command line argument (where "command line" refers to, for example, a character string that is passed to a program being invoked by a UNIX exec system call) that names the socket name (generated at runtime by the dispatch module 105) for the simulator socket 109. The dispatch module 105 then waits for the simulation environment process to connect to the simulator socket 109. In the preferred embodiment, in which the simulation environment 101 is a Verilog program module, connection to the simulator socket 109 is made by calling a special Programming Language Interface function 107 that, in turn, calls a corresponding verification system library function that connects to the simulator socket 109 by name.

After establishing a socket link with the simulation environment 101, the dispatch module 105 forks off each test script 103 and includes a command line argument that names the socket name (generated at runtime by the dispatch module 105) for the test socket 111. The dispatch module 105 then waits for the test script process to connect to the test socket 111. Each test script 103 connects to the test socket 111 by calling a verification system library function that connects to the test socket 111 by name.

After linking with the client processes, the dispatch module 105 monitors each of the simulator and test sockets 109, 111 for incoming packets. In response to receiving a data packet on one of the two sockets 109, 111, the dispatch module 105 sends the packet to a client process by means of the other socket 111, 109. For example, when the dispatch module 105 receives a packet from the test socket 111, it sends the received packet to the simulator socket 109. The transmission of packets through the simulator and test sockets 109, 111 is the vehicle by which the C-based test scripts 103 and simulation environment 101 communicate.

Each socket in the verification system 100 preferably allows multiple stream connections, so that the dispatch module 105 can fork multiple test scripts 103 and allow them to run concurrently. The simulation environment 101 can also have multiple streams running concurrently. These concurrent simulation environment streams may be handled by separate master models 113 within the simulation environment 101, or they may be alternatively handled by a single master model 113. For example, a simulation environment 101 may include two modeled CPUs that coexist on the same simulated memory bus (not shown). Each of the modeled CPUs is capable of reading and writing to a modeled memory unit. In this situation, the dispatch module 105 forks off the simulation environment 101, forks off two test scripts 103 that read and write from the memory unit, links each test script 103 with a corresponding one of the modeled CPUs, and allows each modeled CPU with its corresponding test script 103 to run in parallel. The simulation environment 101 allows both of the modeled CPUs to arbitrate for the memory bus and perform read and write memory operations.

It can be seen from the above that for each simulation environment stream, the dispatch module 105 requires a corresponding test script stream. The dispatch module 105 directly links these streams together by transferring data packets between the linked streams.

High-level pseudo-code for the dispatch module 105 follows:

Pseudocode for Dispatch Module

```
/* In the following, it is assumed that the command line that invokes the
dispatch module includes several parameters */
parse the command line stream to retrieve the parallel stream count, the total
test count, and a filename of a file containing a list of test scripts;
if the parallel stream count was not in the command line
    set parallel stream count equal to 1;
if the total test count was not in the command line
    set the total test count equal to 1;
if the test script filename was not in the command line
    set the test script filename equal to "tst.files";
read names of test scripts from file designated by filename;
create a unique, random simulator socket name;
create a unique, random test socket name;
open a simulator socket;
open a test socket;
fork simulation environment while passing the simulator socket name;
for each parallel stream            /* The simulation environment must be
                                       coded to handle the number of parallel
                                       streams designated by the parallel
                                       stream count */
    wait for simulation environment to connect with the simulator socket;
for each parallel stream
    select a test;                   /* Selected from names of test scripts */
    fork the test;
    wait for the test to connect with the test socket;
while not all tests have run
    wait for a data packet from either the simulator socket or the test socket;
```

| Pseudocode for Dispatch Module |
|---|
| for each parallel stream /* Packet has been received */<br>  if a test script sent a packet<br>    if the packet contains a close test command<br>      close the test stream;     /* Removes software file pointers to<br>                                      the stream, and deallocates<br>                                      memory in order to create space<br>                                      for new stream connections */<br>    if not all the tests have run<br>      select a next test script;<br>      fork the next test script;<br>      wait for the next test script to connect with the test socket;<br>    else /* No more tests to run */<br>      close the simulator stream associated with the test stream;<br>  else /* Packet does not contain a close test command */<br>    send the packet to the corresponding simulation environment<br>stream;<br>    if the simulation environment sent a packet<br>      send the packet to the corresponding test stream;<br>/* All tests completed */<br>remove the simulator socket;<br>remove the test socket; |

Format of Socket Packets

The encryption technique for formatting the dam packets that are communicated between the test script 103 and the simulation environment 101 will now be described with reference to FIG. 2. These packets are formatted by the sending process (either the test script 103 or the simulation environment 101), received by the dispatch module 105, and then forwarded, without modification, to the receiving process (either the simulation environment 101 or the test script 103) which then decodes the packet and acts accordingly.

The informational content of any particular packet is determined by the person or persons who design the master model 113 and the particular tests to be run. Generally, the master model 113 is a CPU model. In this case, each test script command causes the master model 113 to perform CPU related tasks. Examples of CPU tasks are reading and writing memory, reading and writing internal registers, etc. In order to command the CPU model to execute a CPU instruction, the test script uses an encryption technique, described below, in order to encode a packet to include that CPU instruction as well as any necessary parameters. The packet is then communicated to the CPU model, using the dispatch module 105 as described above. For example, a test script may require the CPU model to execute a read instruction. In order to accomplish this, the test script must supply the CPU model with at least a read command and an address. The test script 103 places this information into a dynamically loaded data packet and sends the packet to the CPU model within the simulation environment 101.

Figure 2:
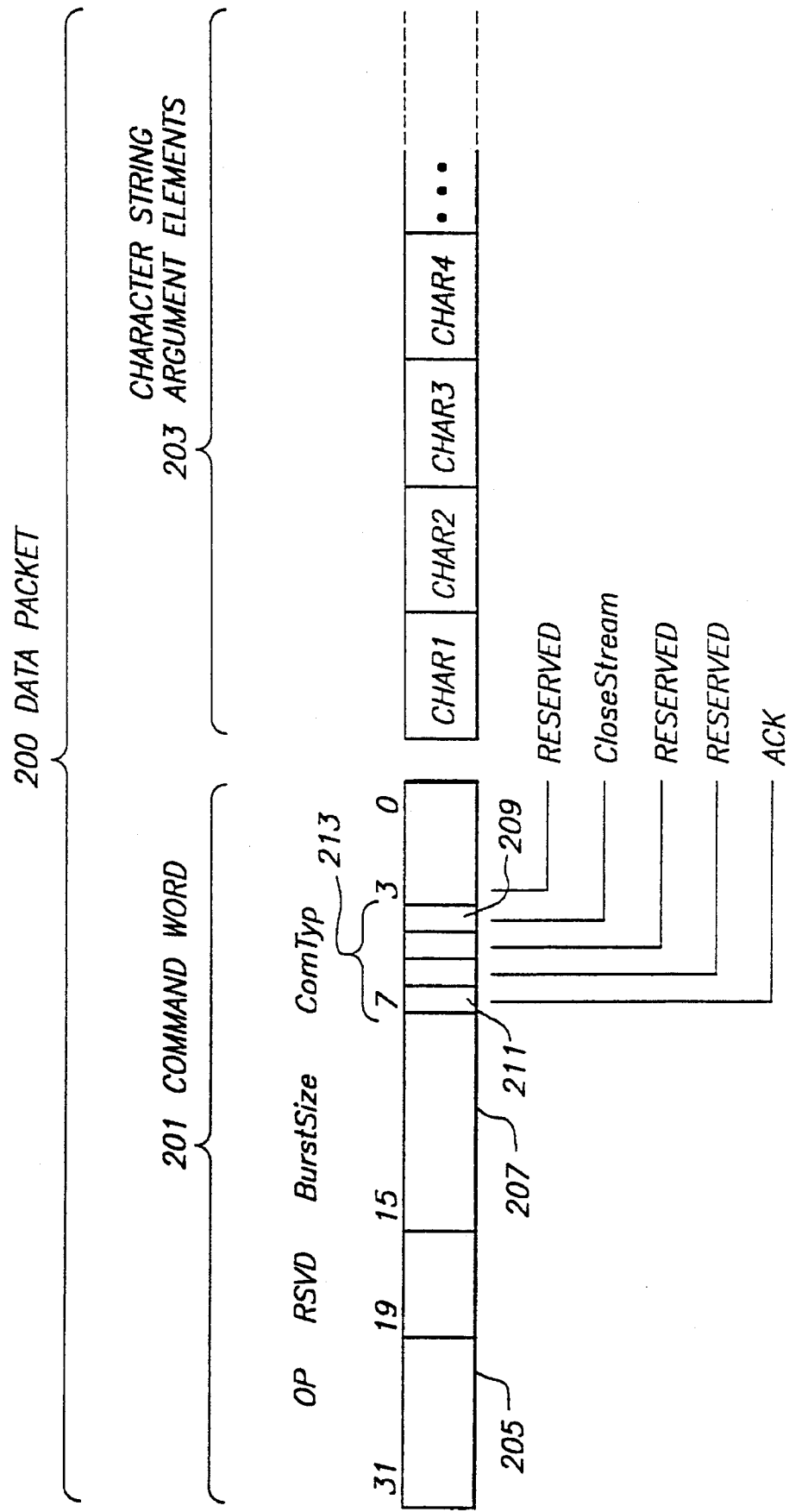
FIG. 2 is a diagram of the format that is used to encode packets in accordance with one aspect of the invention.

Referring now to FIG. 2, the data packet 200 consists of a command word 201 (a 32 bit wide integer value that is encoded as a character string containing ASCII representations of the hexadecimal digits of the command word 201) followed by an array of character string argument elements 203 that are delimited by the new line character. The command word 201 contains a user encoded instruction op code 205, a user encoded argument element count ("burst size") 207, and special codes to denote the end of a test stream ("closeStream") 209 and acknowledgment ("ack") 211. The argument elements 203 are character string representations of both numbers and ASCII text. Encoding and decoding of the numbers, usually integer values, requires number to ASCII and ASCII to number translations within the programming language. The use of character strings rather than integer data types allows the verification system 100 to be more easily ported to different computer systems without concern for issues such as whether the computer stores the high bytes of integers before or after the low bytes.

In the preferred embodiment, the op field 205 contains a twelve bit op code value. The user can encode any value in this field and decode the value to implement any task, as long as each task uses a unique value. The user just needs to remember that the value a test encodes into this field needs to also be decoded properly by the master model 113. For example, the user might construct a master model 113 that can execute three commands: read word, write word, and wait. Consequently, three op codes might be defined to implement these commands: rdWrdOp=0x001, wrtWrdOp=0x002, and waitOP=0x003 (where the prefix "0x" indicates hexadecimal values). When a test creates a data packet, it must use the proper op code to instruct the master model 113 to execute a command. In the case of a read word operation, the test script fill the command word of the data packet with the rdWrdOp. Likewise, when the master model finds the rdWrdOp in the command word, it needs to respond with the expected command.

The burstSize field 207 is preferably an eight bit value that represents the number of character string arguments (not the number of elements 203) that follow the command word 201. The arguments are encoded as character strings that represent address, count, data size, data, etc. For example, if a write word command requires both an address and dam, then the burstSize field contains a value of two. The actual number of character string argument elements 203 would depend on how many characters were required to represent the address and dam. The designer of the master model 113 would know these values, so they need not be encoded in the command word 201.

The comTyp field 213 contains special codes that are used by the test script 103, master model 113, and the dispatch module 105. The field is preferably eight bits wide with each bit representing a special action.

The verification system 100 has been designed to support two of these bits. The remaining bits allow for future growth. Bit seven is the ack bit 211. A process sets this bit when it replies to a previous data packet. Since, in the verification system 100, it is always the simulation environment 101 that responds to commands sent by the test script 103, and never the other way around, it is only the simulation environment 101 that sets the ack bit 211 after a requested task has been performed.

Bit four is preferably the closeStream bit 209. A process sets this bit when it wants to close its connection with the dispatch module 105. Since test scripts 103 are solely responsible for initiating socket packet transactions in the verification system 100, test scripts 103 are the only processes that set the closeStream bit 209. A test script 103 sets the closeStream bit 209 when it ends or when it otherwise wishes to break socket communication with the master module 113 in the simulation environment 101. Having the closeStream bit 209 set signals the dispatch module 105 to break connection with the test script and to try to select another test. If the dispatch module 103 cannot select another test script 103 to begin running, it breaks connection with the corresponding master model 113. Otherwise, the dispatch module 105 establishes communication with a new test script 103. If the master model 113 sees the closeStream bit 209 set, it too breaks socket connection.

As previously described, character string argument elements 203 follow the command word 201 in the data packet 200, and contain information necessary for executing a command. A new line character ("\n") separates each argument string and acts as the end character for the C language "get" routines (described below). For purposes of illustration, the character string argument elements 203 associated with a read word operation will now be described. Here the test script 103 only needs to supply the master model 113 with an address to read from. For this example it will be assumed that the address is 0x1fff0000, and that the rdWrdOp code is again 0x001. The test script 103 needs to send the address as an argument following the command word 201. The test script 103 first encodes the command word 201 so that it will contain the rdWrdOp code in the op field 205 and a value of one in the burstSize field 207 (to indicate that only one argument, that is the address parameter, is being passed; the master model 113 will recognize the end of the character string argument elements 203 when it encounters the new line character ("\n")). Thus, the command word 201 portion of the dam packet 200 will be encoded as the character string "0x00100100\n". The test script 103 next encodes the character string argument elements 203 so that it will contain the character string "0x1fff000\n" (indicating the address from which the dam should be read). For this transaction, then, the test script 103 sends the packet "0x00100100\n0x1fff0000\n" across the test socket 111 to the dispatch module 105. Since the closeStream bit 209 has not been set, the dispatch module 105 merely forwards the entire packet to the master model 113 via the simulator socket 109.

The master model 113 receives this packet, decodes the op code, collects the argument as the address, and acts upon the command. After it reads the data, for example 0x1234abcd, it needs to pass back an acknowledgment command word followed by the read data. Accordingly, the master module 113 sends the packet "0x000000180\n0x1234abcdNn" across the simulator socket 109 to the dispatch module 105. The first character string, ending with a new line character, contains the command word with a burst size of one and an acknowledgment code. The second character string, ending with a new line character, contains the read data. The dispatch module 105 then forwards the entire packet across the test socket 111 to the test script 103.

The test script 103 receives this packet, checks for an acknowledgment code, and gathers the data, thereby completing the read word operation. Since the test script initiated the read word transaction, it knew that the acknowledgment packet from the master model 113 would contain the read data as an argument. The test script 103 then moves on to the next command transaction.

Verification System Library

Figure 3A:
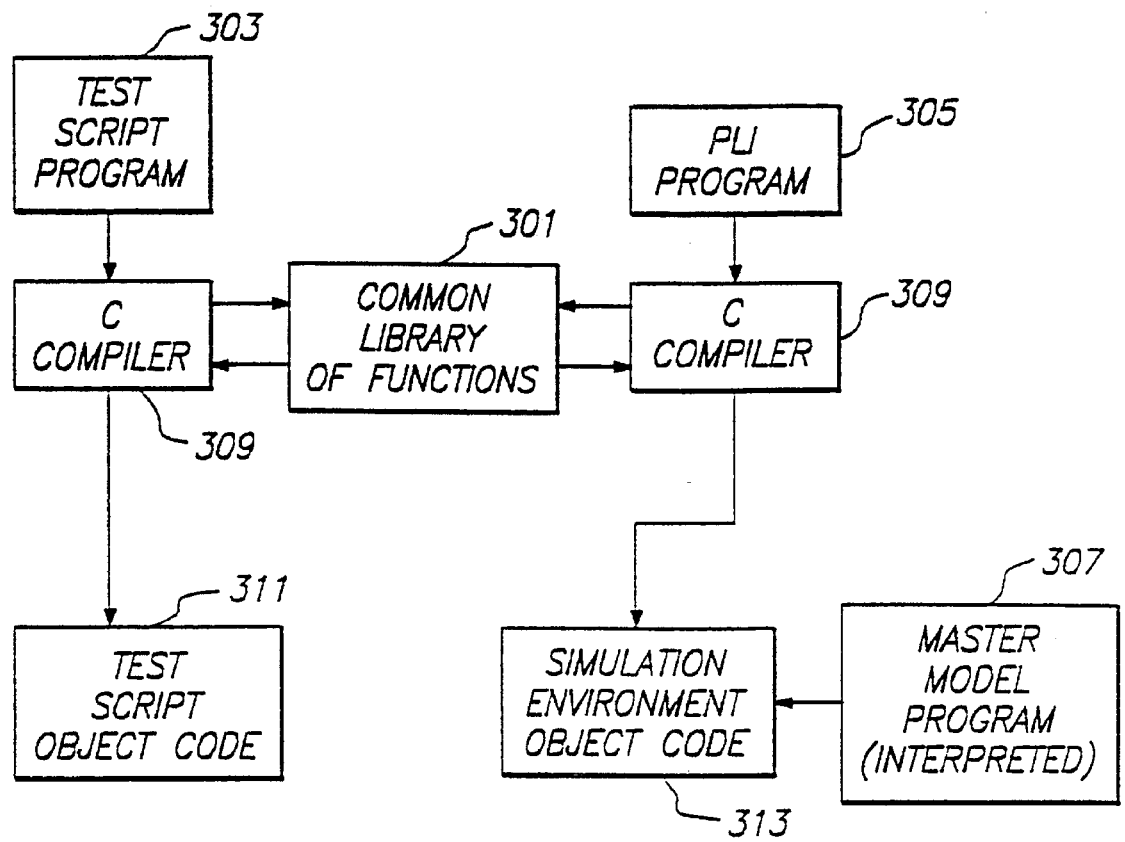
FIGS. 3(a) and 3(b) are block diagrams showing the use of a common library of functions as part of the process of making test script and master model programs in accordance with another aspect of the present invention.

Referring now to FIG. 3(a), in accordance with another aspect of the invention, the verification system 100 provides a common library of functions ("routines") 301, callable from C, to assist the test script writer in creating proper data packets 200, and to ensure that these packets 200 are properly transmitted and received. As will be described in greater detail below, in the preferred embodiment of the invention the common library of functions 301 may also be accessed from the master model 113 (written in the Verilog HDL programming language) by means of the Programming Language Interface (PLI) 305 that is included within the Verilog simulation environment.

To use the common library of functions 301, one writes a test script program 303 and a master model program 307, each including references to invoke the desired verification system functions that are provided in the common library of functions 301. Because the test script program 303 is preferably written in the C programming language, the test script may readily invoke routines from the verification system library. In the master model program 307 (preferably written in Verilog HDL language, which is an interpreted rather than compiled language), invocations to library functions must be made by means of references to functions that have been incorporated into the Verilog PLI 305 (described below). Use of the Verilog PLI 305 is well known in the art, and a complete description of this methodology is beyond the scope of this description. However, a brief description is now provided.

Each of the test script and PLI programs 303, 305 is compiled, using the C compiler 309. During compilation, the common library of functions 301 will be accessed, and object code corresponding to invoked functions will be retrieved for incorporation into the object code that embodies the runnable test script program 311 and the runnable simulation environment program 313. The use of shared libraries is also well known in the art, and is not described here in greater detail.

As was mentioned above, the Verilog HDL language is interpreted rather than compiled. Consequently, when the simulation environment program 313 is executed, it will interpret each line of the master model program 307. References in the master model program 307 to verification system library functions will be resolved by executing corresponding object code that has been pulled into the simulation environment 3 13 from the common library 301.

Figure 3B:
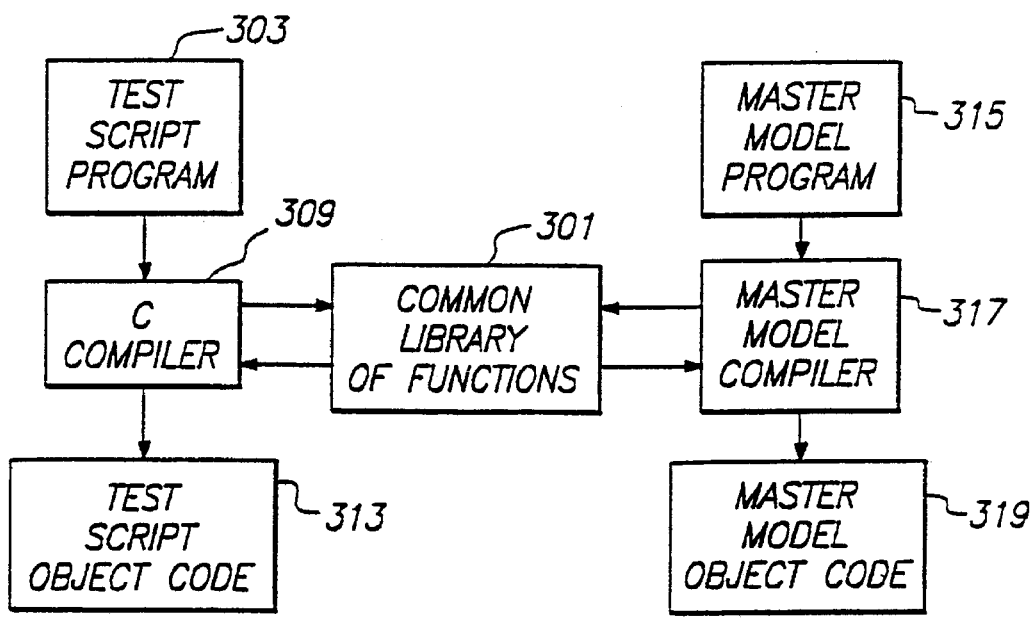

Referring now to FIG. 3(b), an alternative embodiment of the invention is shown in which the master model program 315 is compiled for execution, rather than interpreted by the simulation environment. Here, routines from the common library of functions 301 may still be incorporated so long as the master model compiler 317 (for example, a C compiler) is capable of utilizing shared libraries. The output of the master model compiler 317 is master model object code 319 which may be directly run on a computer. The master model object code 319 includes object code corresponding to those verification system routines that were referenced in the master model program 315. The remaining features illustrated in FIG. 3(b) are the same as those shown in FIG. 3(a), and will not be described here further.

The common library of functions 301 includes three sets of functions. The first set deals with the use of a socket. The second set deals with the dam packet. The last set deals with miscellaneous issues.

Below is a summary of the socket-related functions, and high-level pseudocode illustrating preferred implementations of these functions.

---

ConnectSocket

```
int
ConnectSocket (socketName, programName)
char *socketName, programName;
/* ConnectSocket() forms a connection with the socket referenced by
socketName, the name generated by the dispatch module 105 and passed to
the current process in a command line argument. It sets a global variable to
programName, the name of the current process. The other library routines
use programName for error messaging, etc. ConnectSocket() returns a
unique socket identifier (an integer value) to the connection.
*/
{
    /* Global socket info array refers to an array of socket info
        structures. Each socket info structure contains read/write
        pointers to the socket, the name of the current process, and a
        pointer to a socket packet structure. The socket packet
        structure contains the command and a character string array of
        the arguments to be passed across the socket. */
    If first socket creation
        Set socketId to zero;
        Create first socket info structure element of the global socket
            info array;
    Else
        Increment socketId;
        Append a new structure element to the global socket info
            array;
    Get descriptor to socket connection by        /* Preferably use UNIX */
        way of socketName;                         /* "socket()" and "connect()"
                                                      system calls */
    Set up file pointers to the descriptor;        /* Allows access to the socket
                                                      as a file. */
    Store descriptor and file pointers to the socketId element of the global
        socket info array;
    Add programName to the socketId element of the global socket info
        array.
    Receive a test socket packet from             /* The client process receives a */
        the dispatch module;                       /* socket packet containing an
                                                      ASCII string. If the expected
                                                      ASCII string was received, then the
                                                      connection is working. */
    Send an acknowledge back to the server;
    Return SocketId to the calling functions;
}
```

SendSocket

```
void
SendSocket (socketId)
int socketId;
/* SendSocket() transmits the data packet, located at index value
socketId of a global data packet array, across the socket stream associated
with socketId.
*/
{
    Get the socket packet structure from the socketId
        element of the global socket info array;
    Get the socket file pointer from the socketId element of
        the global socket info array;
    Wait until the socket associated with the socket file pointer is
        ready for writing;
    Write the command word to the socket associated with the socket file
        pointer;
    Write all socket packet structure arguments to the socket associated
        with the socket file pointer;
}
```

ReceiveSocket

```
SOCKET_PACKET_PTR
ReceiveSocket (socketId)
int socketId;
/* ReceiveSocket() waits for a data packet transmission across the socket
stream associated with socketId. After it receives the data packet, it places
the data packet into a global data packet array at index value socketId. It
returns a pointer to the data packet at index value socketId of the global data
packet array.
```

```
*/
{
    Get the socket packet structure from the socketId
        element of the global socket info array;
    Get the socket file pointer from the socketId element of
        the global socket info array;
    Wait until the socket associated with the socket file pointer is
        ready for reading;
    Read the first string from the socket associated with the socket file
        pointer;
    Convert the string to an integer value;      /* First string should be a
                                                    command */
    Store the integer value in the socket packet structure as the
        command word;
    Deallocate any character string arguments in the socket packet
structure;
    Extract the burstSize from the command word;
    Allocate burstSize character string arguments in the socket packet
        structure;
    Repeat burstSize times
        Read a string from the socket associated with the socket file
            pointer;
        Store each string as an argument in the socket packet
structure;
}
CloseStream void
CloseStream (socketId)
int socketId;
/* CloseStream() breaks the socket stream connection associated with
socketId. It also removes the data packet at index value socketId from a
global data packet array.
/*
{
    Get the socket file pointer from the socketId element of
        the global socket info array;
    Close connection specified by socket file pointer;
    Deallocate socketId element of the global socket info array;
}
```

Below is a summary of the data packet-related functions, and high-level pseudocode illustrating preferred implementations of these functions. These functions alter the contents of a global data packet array that maintains the data packet information for each socket stream.

```
BuildSocketPacketCommand

SOCKET_PACKET_PTR
BuildSocketPacketCommand (socketId, command)
int socketId;
unsigned int command;
/* BuildSocketPacketCommand() sets up the command word of the data
packet at index value socketId of the global data packet array. If the
burstSize field of the command word contains a value larger than zero, then
BuildSocketPacketCommand() allocates memory for burstSize character
strings. It returns a pointer to the data packet at index value socketId of the
global data packet array.
*/
{
    Get the socket packet structure from the socketId
        element of the global socket info array;
    Store command in the socket packet structure as the command word;
    Deallocate any character string arguments  /* These character string */
        in the socket packet structure;        /* arguments are left over
                                                  from the previous use */
    Extract the burstSize from the command word;
    Allocate burstSize character string arguments in the socket packet
        structure;
    Return a pointer to the socket packet structure;
BuildSocketPacketInteger SOCKET_PACKET_PTR
BuildSocketPacketInteger (socketId, offset, integerValue)
int socketId;
unsigned int offset, integerValue;
/* BuildSocketPacketInteger() converts integerValue to a character string
```

-continued and stores the string into the data packet at index value socketId of the global
data packet array as argument offset. It returns a pointer to the data packet
at index value socketId of the global data packet array.
/*
{
   Get the socket packet structure from the socketId
      element of the global socket info array;
   Convert integerValue to a dynamically allocated character string;
   Store the character string as the offset argument in the socket
      packet structure;
   Return a pointer to the socket packet structure;
}
BuildSocketPacketString SOCKET_PACKET_PTR
BuildSocketPacketString(socketId, offset, stringValue)
int socketId;
unsigned int offset;
char *stringValue;
/* BuildSocketPacketString() stores stringValue as argument offset into
the data packet at index value socketId of the global data packet array. It
returns a pointer to the data packet at index value socketId of the global data
packet array.
*/
{
   Get the socket packet structure from the socketId
      element of the global socket info array;
   Store stringValue as the offset argument in the socket
      packet structure;
   Return a pointer to the socket packet structure;
}
ExtractSocketPacketCommand unsigned int
ExtractSocketPacketCommand (socketId)
int socketId;
/* ExtractSocketPacketCommand() returns the command word of the
data packet at index value socketId of the global data packet array.
*/
{
   Get the socket packet structure from the socketId
      element of the global socket info array;
   Return the command word of the socket packet structure;
}
ExtractSocketPacketInteger unsigned int
ExtractSocketPacketInteger (socketId, offset)
int socketId;
unsigned int offset;
/* ExtractSocketPacketInteger() returns argument offset of the data
packet at index value socketId of the global data packet array as an unsigned
integer.
*/
{
   Get the socket packet structure from the socketId
      element of the global socket info array;
   Convert the offset argument of socket packet structure to an integer;
   Return the integer;
}
ExtractSocketPacketString char *
ExtractSocketPacketString (socketId, offset)
int socketId;
unsigned int offset;
/* ExtractSocketPacketString() returns argument offset of the data packet
at index value socketId of the global data packet array as a character string.
*/
{
   Get the socket packet structure from the socketId
      element of the global socket info array;
   Return the offset argument of socket packet structure;
}

The following function, which may be considered a miscellaneous function, assists the user with applying the other library functions. A summary of this function is presented, followed by high-level pseudocode illustrating a preferred implementation.

ExtractTstSocket

```
char *
ExtractTstSocket (argc, argv)
int argc;
char *argv[];
/* ExtractTstSocket() grabs the socket name from the argument list.
The parameter argv acts as a pointer to this list of character strings, and argc
acts as a count to the number of arguments in this list. The function returns
the socket name.
*/
{
   /* argv is a character string array of command line arguments. */
   For index range from 1 to argc - 1
      If index element of argv equals "-socketName"
         Extract the socketName character string from the next
            element of argv;
   Return the socketName;
}
```

The Test Script 103

In the preferred embodiment, the user writes each test script 103 in the C programming language. Compared to assembly, Verilog HDL, Logic Modeling's PCL, or a user created language, C provides both flexibility and a large array of command control capabilities. For example, C offers many flow control directives such as "while" and "for" loops and "if-then-else" and "switch-case" structures. It offers powerful string manipulation commands such as "sprintf", "strcmp", "strcpy", and others for handling text and messaging. By comparison, Verilog HDL provides no built-in functions for string manipulation. Finally, C hosts hundreds of low-level and miscellaneous functions to allow the user to control everything from integer to string translations to operating system event handling. These latter functions allow the C-based test scripts to communicate to a master model 113 through the above-described sockets 109, 111.

Every test follows the same structure when communicating with a master model 113. First the test opens a socket stream connection with the dispatch module 105 using the ConnectSocket() function call. The dispatch module 105 will link this connection stream with a corresponding connection stream associated with the master model 113.

Next, the test script sends command requests to the master model 113 by calling verification system library routines (described above). The test script 103 uses the command requests to verify the functionality of the board or chip under control of the simulation environment 101. The test script 103 may call the library routines directly. Alternatively, the test script 103 may be designed to call the library routines indirectly by instead calling user-written higher level functions that in turn call verification system library routines. In the indirect method, the test appears "cleaner". This offers a slight advantage to the user, since the test script 103 will not be cluttered by repetitive appearances of library commands. Instead, more meaningful operation names may be used to indicate the flow of the test.

After the test script 103 performs its job, it informs the dispatch module 105 that it wishes to close the socket. The test script 103 sends a closeStream command word to the dispatch module 105, waits for an acknowledgment from the dispatch module 105, and then executes the CloseStream() library function. Depending on the state of the dispatch module 105, the number of tests that have run, and the number of parallel socket streams connections that are open, the dispatch module's exit procedure will either select another test, close the corresponding master model-to-dispatch module stream connection, or cleanly exit.

To illustrate the make-up of a test script 103, the source code of an example test script will now be presented. This simple memory test writes a word of data, 0x12345678, to address location 0x0000abcd, reads back the dam, and verifies that the data returned as expected.

The example test script illustrates the standard script sequence in which a socket is opened, one or more tests are performed, and the socket is closed. It also serves as an illustration of the fact that in the performance of tests, test scripts initiate all socket transactions in the verification system 100. That is, the test script creates a data packet of an instruction, such as a write word instruction, and sends the packet. The test script then waits for a data packet to be returned from the master model 113. This returned packet acts as a command acknowledgment packet. When the test expects returned data, the returned packet also contains appropriate, additional data arguments. The example test script follows:

TEST SCRIPT

```
test.c
#include <stdio.h>  /* Standard C input/output routines */
/* Include the verification system library header file. The header
   file contains miscellaneous defines and definitions, such as the bit
   description of the command word acknowledgment. */
#include "stdLibCore.h"
#define wrtOp            0x00100000
#define wrtOpBurstSize   0x00000300
#define rdop             0x00200000
#define rdOpBurstSize    0x00000200
/* SimpleAck verifies the acknowledgment command word. */
void
SimpleAck (socketId, callingFtnName)
int socketId;
char *callingFtnName;
{
   unsigned int command;
   /* Get the command and check it.
   command = ExtractSocketPacketCommand (socketId);
   if ((command & ackMsk) != ack)
   {
      fprintf (stderr, "Bad ack in %s.\n", callingFtnName);
      exit (1);
   }
}
/* WrtWrd writes data into memory location adr.*/
void
WrtWrd (socketId, adr, data)
int socketId;
```

TEST SCRIPT

```
unsigned int adr, data;
{
    /* Construct a write word socket packet.
    /* Set up the command word. Then set up the arguments.
    BuildSocketPacketCommand (socketId, wrtop |
    wrtOpBurstSize);
    BuildSocketPacketInteger (socketId, 0, adr);
    BuildSocketPacketInteger (socketId, 1, data);
    /* Send the packet across the socket.*/
    SendSocket (socketId);
    /* Wait for an acknowledgement packet.*/
    ReceiveSocket (socketId);
    /* Check the command word for an ack.*/
    SimpleAck (socketId, "WrtWrd");
}
/* RdWrd reads data from memory location adr. It returns the
data.*/
unsigned int
RdWrd (socketId, adr)
int socketId;
unsigned int adr;
{
    /* Construct a read word socket packet.*/
    /* Set up the command word. Then set up the arguments.*/
    BuildSocketPacketCommand (socketId, rdOp | rdOpBurstSize);
    BuildSocketPacketInteger (socketId, 0, adr);
    /* Send the packet across the socket.*/
    SendSocket (socketId);
    /* Wait for an acknowledgement packet along with the
    requested data.*/
    ReceiveSocket (socketId);
    /* Check the command word for an ack.*/
    SimpleAck (socketId, "RdWrd");
    /* Return the data to the calling function.*/
    return (ExtractSocketPacketInteger (socketId, 0);
}
/* Close this test.*/
void
CloseTst (socketId)
int socketId;
{
    /* Construct a closestream command word.*/
    BuildSocketPacketCommand (socketId, closeStreamCode);
    /* Send the packet across the socket.*/
    SendSocket (socketId);
    /* Wait for an acknowledgement packet along with the
    requested data.*/
    ReceiveSocket (socketId);
    /* Check the command word for an ack.*/
    SimpleAck (socketId, "CloseTst");
    /* Close the socket.*/
    CloseStream (socketId);
}
/* When dispatch forks the test, main is the first function called.
C code uses argc and argv within main to access the command
line options. */
main (argc, argv)
int argc;
char *argv;
{
    int socketId;
    unsigned int data;
    /* Establish a connection with the socket The socket name is
    extracted from the command line options. The first element
    of the command line options argument list contains the name
    of the current process.*/
    socketId = ConnectSocket (ExtractTstSocket (argc, argv),
    argv
[0]);
    /* Write 0x12345678 to memory address location 0x0000abcd.*/
    WrtWrd (socketId, 0x0000abcd, 0x12345678);
    /* Read from memory address location 0x0000abcd. */
    data = RdWrd (socketId, 0x0000abcd);
    /* Verify that the data is as expected. */
    if (data != 0x12345678)
```

TEST SCRIPT

```
        fprintf (stderr, "Data mismatch!\n");
    /* Close the test. */
    CloseTst (socketId);
}
```

Verilog HDL and PLI

In the preferred embodiment, the user codes the master model 113 using the Verilog Hardware Description Language (HDL). This language describes a chip level or board level design or part of a design. It can describe both the function of a design and the components and connections in a design. In the case of the verification system 100, the user codes the master model 113 using high-level constructs.

The master model 113 preferably describes function rather than real hardware, although a model of the real hardware would also work with the present invention. The master model 113 monitors the simulator socket 109 for incoming packets and acts upon the receipt of a packet. The master model 113 may manipulate any wire or register within the simulation, perform bus transactions, and set simulation timing. For example, a master model 113 may receive a command to establish a logical one state on a particular wire. (The test script may want to do this, for example, in order to force a particular error to be produced.) The master model 113 performs the command by forcing a 0x1 on the wire and returns an acknowledgement to the test script 103. As another example, a master model 113 might receive a command to write data to a memory location. (The test script 103 might be initializing memory for later operations.) If, for some reason, it is necessary for this operation to be strictly simulated, then the master model 113 may perform the command by asserting and deasserting the control lines to a memory model (also contained within the simulation environment 101) at the appropriate times. After the master model 113 finishes manipulating the control lines to the memory model, it returns an acknowledgement to the test script. Alternatively, the master model 113 can perform the memory initialization without consuming any bus cycles. For example, the master model 113 might decode and recognize a direct memory write command sent from the test script 103. In this case, the master model 113 will bypass the memory control logic and access the memory directly by using the simulation environment 115 array name that corresponds to the simulated memory.

The master model's ability to influence and channel the simulation within the simulation environment (e.g., the Verilog simulation environment) allows the master model 113 to control the entire event path of the simulation. This power coupled gives the user the ability to create test scripts for verifying every aspect of the design.

The master model 113 communicates to the simulator socket 109 by calling verification system Programming Language Interface (PLI) library functions. In the preferred embodiment, the Verilog simulation environment includes a PLI for allowing the user to access C code from the Verilog simulation environment. The verification system PLI library functions act as wrappers to the verification system C library functions (described in detail above). The main difference between the libraries is with the function names.

The verification system PLI library function names are preferably identical to the verification system C library function names except that they begin with '$' and end with "PLI". For example, the master model 113 access the SendSocket() function by means of a call to a routine called $SendSocketPLI().

Except for the name differences, only two functional difference exist between the libraries. First, the verification system PLI library does not support the ExtractTstSocket() function. Instead, the verification system PLI library routine entitled $ConnectSocketPLI() parses the Verilog command line options by calling a built-in Verilog PLI interface function. Also, the $ConnectSocketPLI() routine does not require a programName field, because it extracts the program name by calling another built-in Verilog PLI interface function.

The second functional difference exists with the CloseStream() function. The verification system PLI library function entitled $CloseStreamPLI() automatically sends an acknowledgment command word to the dispatch module 105 before it closes the socket stream connection. By comparison, the verification system C library counterpart function only closes the socket stream connection (i.e., frees up the file pointer associated with the socket stream).

By using the verification system PLI library functions, every master model 113 follows the same structure when communicating with one or more test scripts 103. First the master model 113 opens one or more socket streams with the dispatch module 105 by using the $ConnectSocketPLI() function. Remember, for each simulation environment stream, the dispatch module 105 selects a test script and establishes a corresponding test script stream to link with the simulation environment connection.

Next, the master model 113 waits for a data packet from the corresponding test script using the $ReceiveSocketPLI() function. The master model 113 decodes the command word 201 of the packet and performs the requested action. After each action, the master model 113 returns an acknowledgment command word. If the test script 103 requested data, the master model 113 returns data with the acknowledgment packet. The master model 113 performs this wait-for-a-command and act-upon-the-command loop for each connected stream.

If the command word 201 of a received packet contains a closeStream code, the master calls the $CloseStreamPLI() function to break the stream connection with the dispatch module 105. The master module also stops listening to the connection for packets. If all connections streams break connection, then the master module 113 tells the simulation environment 101 to exit.

To illustrate the make-up of a simple master model implemented in a Verilog simulation environment 101, the source code of an example master model will now be presented. This example model acts upon read and write word instructions and has code to exit cleanly. The example master model supports only a single stream connection. Those having ordinary skill in the art will readily be able to apply the illustrated principles to produce a master model that supports multiple stream connections. The example master model follows:

---
EXAMPLE VERILOG MASTER MODEL
---

```
master.v
  module simpleCPU;
    integer command;
    integer socketed;
    integer done;
    /* Define address and data as 32 bit wide registers.*/
    reg [31:0]adr;
    reg [31:0]data;
    /* Define the bit positions of the socket command word
```

---
EXAMPLE VERILOG MASTER MODEL -continued
---

```
    codes.*/
    parameter
      closeStreamMsk  = 32'h10,
      closeStream     = 32'h10,
      ackMsk          = 32'h80,
      ack             = 32'h80,
      opMsk           = 32'hff00000,
      burstSizeMsk    = 32'h0000ff00;
    /* Define the op code command parameters. The op codes must
       correspond directly to the op codes defined within the test
       script.*/
    parameter
      rdOp            = 32'h00200000,
      wrtOp           = 32'h00100000;
    /* Set up a socket connection with the dispatch module. Make
       only one connection stream for this master.*/
    initial
      socketId = $ConnectSocketPLI
    /* The "always" construct forms an endless loop that repeats
       the receive packet/act on packet/acknowledge packet
       cycle.*/
    always begin
      /* Wait for the test to send a packet on the socketId stream.*/
      $ReceiveSocketPLI (socketId);
      /* Get the command word. */
      command = $ExtractSocketPacketCommandPLI (socketId);
    /* Determine whether the test is closing the socket stream.*/
    if (command & closeStreamMsk) begin
      /* Close the stream. Set a flag while doing so.*/
      $CloseStreamPLI (socketId);
      done = 1;
    end
    else begin
      /* Case the op code of the command.*/
      case (command & opMsk)
        rdOp: begin
          /* Get address argument of the packet. The position of
          the arguments must correspond directly to the positions
          defined by the test script. */
          adr = $ExtractSocketPacketIntegerPLI (socketId, 0);
          /* Perform the actual read function here. This is the
          point in which the master manipulates the wires,
          registers, and timing of the simulation. This function is
          not detailed in this example. It is unique for the
          simulation environment at hand.*/
          RdWrdTask (adr, data);
          /* After the completion of the read word task,
          acknowledge the test and send the read data as argument
          zero. Supply the command word with both the
          acknowledgement code and a burst size of one for the
          data argument. */
          $BuildSocketPacketCommandPLI(socketId,ack |
          32'h0100);
          $BuildSocketPacketIntegerPLI (socketId, 0, data);
          $SendSocketPLI (socketId);
        end
        wrtOp: begin
          /* Get address and data arguments of the packet. The
          position of the arguments must correspond directly to the
          positions defined by the test. */
          adr = $ExtractSocketPacketIntegerPLI (socketId, 0);
          data = $ExtractSocketPacketIntegerPLI (socketId, 1);
          /* Perform the actual write function here. This is the
          point in which the master manipulates the wires,
          registers, and timing of the simulation. This function is
          not detailed in this example. It is unique for the
          simulation environment at hand. */
          WrtWrdTask (adr, data);
          /* After the completion of the write word
          task, acknowledge the test. */
          $BuildSocketPacketCommandPLI (socketId, ack);
          $SendSocketPLI (socketId);
        end
        default:
          /* Generate an error message, because the master found
          an unsupported op code in the command word. */
          $display ("Command %h unknown.", command);
      endcase
```

EXAMPLE VERILOG MASTER MODEL

```
    end
    /* If the done flag is set, then all socket stream connections are
    closed. Therefore, tell Verilog to exit cleanly. */
        if (done)
            $finish;
        end
endmodule
```

The above-described verification system provides many advantageous features. The dispatch module 105, acting as a server to two clients (i.e., the test script 103 and the master model 113), allows both the test script 103 and the master model 113 to be similar to one another and call the same basic functions. Without this arrangement, this advantage would be lost because one or the other of the test script 103 and the master model 113 would have to play the part of the server, and the other the pan of the client.

The inventive verification system provides an instruction language that has a large command set that allows manipulation of every part of the simulation environment. The instruction language codes and debugs easily, supports detailed and complicated data structures, and is compatible with other industry software.

Furthermore, the test instruction language of the inventive verification system is implementation independent. For example, if a board design requires a new CPU, an engineer needs only to recode the master model to emulate the new CPU. The updated master model utilizes the same packet protocol but executes different transaction tasks for each received command. In this way, the engineer can still execute the tests coded for the old board design.

In addition, the inventive verification system is portable and consistent. An engineer can port the system to any simulation environment. Since the heart of the verification system, namely the dispatch module, remains the same, the engineer needs only to provide a data packet protocol, a master model, and tests for each new simulation environment. If the engineer adopts a fundamental protocol and continues to build upon it, the engineer needs only to provide a master model and test scripts for each new simulation environment. In this case, the test instruction language remains consistent for all environments. For example, an engineer might create a RdBurst() function to read more than one word of memory at a time. In all future environments, the engineer can continue to call RdBurst().

The inventive verification system has an adaptable instruction language that allows an engineer to hierarchically build upon instructions, use the same instructions in future designs, and even use the same tests. Overall, the system shortens the time the engineer requires to set up a verification environment and to start coding test scripts. The net result is that the engineer spends more time on the contents of the test scripts.

The verification system's socket mediation program (i.e., the dispatch module 105), allows multiple tests to run in parallel. Now, an engineer can concurrently test different parts of a design and verify that the different parts don't interfere with each other. For example, an engineer might have two tests: one that verifies operation of a memory, and another that verifies operation of an I/O device. The engineer can verify, with the simultaneous actions of the test scripts, that memory transactions and I/O transactions do not affect each other. Taking this situation one step further, an engineer can code dozens of tests and have dispatch randomly select between them. The engineer can also set up the environment to handle many parallel test streams. In this case, the inventive verification system offers an almost infinite number of test combinations and permutations. This random test methodology helps find interlock bugs, problems with communication between chips or between blocks within a chip, and other non-obvious bugs.

The invention has been described with reference to a particular embodiment. However, it will be readily apparent to those skilled in the art that it is possible to embody the invention in specific forms other than those of the preferred embodiment described above. This may be done without departing from the spirit of the invention. The preferred embodiment is merely illustrative and should not be considered restrictive in any way. The scope of the invention is given by the appended claims, rather than the preceding description, and all variations and equivalents which fall within the range of the claims are intended to be embraced therein.

What is claimed is:

1. A hardware design verification system comprising:
   simulator means for simulating a hardware environment having a circuit under test coupled to a master model;
   test script means for executing a test script;
   dispatch means;
   first inter-task communication means for transmitting a packet from the test script means to the dispatch means: and
   second inter-task communication means for transmitting a packet from the dispatch means to the simulator means, wherein:
      the test script means uses the first inter-task communication means to transmit a first packet to the dispatch means, the first packet being encoded in accordance with a predetermined encryption technique and designating a desired manipulation of the simulated hardware environment;
      the dispatch means, in response to receipt of the first packet, uses the second inter-task communication means to transmit the first packet to the master model; and
      the master model, in response to receipt of the first packet, decodes the first packet in accordance with the predetermined encryption technique and manipulates the hardware environment in accordance with the desired manipulation.

2. The system of claim 1, wherein each of the simulator means, test script means, and dispatch means is an executing computer program under control of an operating system that provides for concurrent execution of computer programs.

3. The system of claim 2, wherein:
   the operating system is a UNIX operating system;
   the first inter-task communication means is a first UNIX socket; and
   the second inter-task communication means is a second UNIX socket.

4. The system of claim 3, wherein each of the simulator means and test script means is a process that is forked from the dispatch means.

5. The system of claim 1, wherein the predetermined encryption technique includes converting an integer value into a character string.

6. The system of claim 1, wherein:
   the first inter-task communication means is further for transmitting a packet from the dispatch means to the test script means;

the second inter-task communication means is further for transmitting a packet from the simulator means to the dispatch means;

the desired manipulation includes detecting a signal value in the circuit under test; and the master model, after detecting the signal value, uses the predetermined encryption technique to include the detected signal value in a second packet and uses the second inter-task communication means to transmit the second packet to the dispatch means;

the dispatch means, in response to receipt of the second packet, uses the first inter-task communication means to transmit the second packet to the test script means; and the test script means, in response to receipt of the second packet, decodes the second packet in accordance with the predetermined encryption technique.

7. The system of claim 1, wherein:

each of the first and second inter-task communication means includes means for inputting a designation of one of a plurality of concurrent transmission streams with which a transmitted packet is to be associated; and in response to receiving, from the first inter-task communication means, a packet associated with a first transmission stream, the dispatch means designates a corresponding one of the plurality of concurrent transmission streams when it uses the second inter-task communication means to transmit the received packet to the master model.

8. A method of verifying a hardware design of a circuit under test, comprising the steps of:

in a computer, concurrently running a hardware simulator, a dispatcher, and a test script, wherein the hardware simulator simulates a hardware environment having the circuit under test coupled to a master model;

using first means for inter-task communication to transmit, from the test script to the dispatcher, a first packet that is encoded in accordance with a predetermined encryption technique, wherein contents of the first packet designate a desired manipulation of the simulated hardware environment;

using second means for inter-task communication to transmit the first packet from the dispatcher to the hardware simulator;

in the hardware simulator, receiving the first packet and, in response thereto, using the master model to decode the first packet in accordance with the predetermined encryption technique and to manipulate the hardware environment in accordance with the desired manipulation.

9. The method of claim 8, wherein:

concurrent running of the hardware simulator, dispatcher, and test script is controlled by a UNIX operating system;

the step of using the first means for inter-task communication to transmit the first packet from the test script to the dispatcher includes using a first UNIX socket; and the step of using the second means for inter-task communication to transmit the first packet from the dispatcher to the hardware simulator includes using a second UNIX socket.

10. The method of claim 9, wherein the step of concurrently running the hardware simulator, the dispatcher, and the test script comprises the steps of:

running the dispatcher;

forking off the hardware simulator as a first child process of the dispatcher; and forking off the test script as a second child process of the dispatcher.

11. The method of claim 8, wherein the predetermined encryption technique includes convening an integer value into a character string.

12. The method of claim 8, wherein:

the desired manipulation includes detecting a signal value in the circuit under test, and further comprising the steps of:

in the hardware simulator, using the master model to detect the signal value;

in the hardware simulator, using the predetermined encryption technique to include the detected signal value in a second packet;

transmitting the second packet from the hardware simulator to the second inter-task communication means in the dispatcher;

transmitting the second packet from the first inter-task communication means in the dispatcher to the test script; and in the test script, decoding the second packet in accordance with the predetermined encryption technique.

13. The method of claim 8, wherein the step of using the second means for inter-task communication to transmit the first packet from the dispatcher to the hardware simulator comprises the steps of:

in the dispatcher, using the second means for inter-task communication to receive the first packet and a designation that the first packet is associated with a first one of a plurality of concurrent first transmission streams; and in the dispatcher, supplying second means for inter-task communication with the received packet and a designation of a selected one of a plurality of concurrent second transmission streams, wherein the selected one of the plurality of concurrent second transmission streams corresponds to the first one of the plurality of concurrent first transmission streams.

14. The method of claim 8, further comprising the preliminary steps of:

using a first programming language to generate a test script computer program comprising invocations of at least one of a plurality of predefined verification system functions;

using a second programming language to generate a master model computer program comprising invocations of at least one of the plurality of predefined verification system functions;

compiling the test script computer program to produce the test script, wherein the step of compiling the test script computer program includes accessing a shared library of functions to retrieve object code corresponding to the at least one of the plurality of predefined verification system functions invoked by the test script computer program; and compiling the master model computer program to produce the master model, wherein the step of compiling the master model computer program includes accessing the shared library of functions to retrieve object code corresponding to the at least one of the plurality of predefined verification system functions invoked by the master model computer program.

15. The method of claim 14, wherein the first programming language is not the same as the second programming language.

16. The method of claim 15, wherein:

the at least one of the plurality of predefined verification system functions invoked by the test script computer program includes a first verification system function; and the at least one of the plurality of predefined verification system functions invoked by the master model computer program includes the first verification system function.

17. The method of claim 8, further comprising the preliminary steps of:

using a first programming language to generate a test script computer program comprising invocations of at least one of a plurality of predefined verification system functions;

using a second programming language to generate a master model computer program comprising invocations of at least one of the plurality of predefined verification system functions;

compiling the test script computer program to produce the test script, wherein the step of compiling the test script computer program includes accessing a shared library of functions to retrieve object code corresponding to the at least one of the plurality of predefined verification system functions invoked by the test script computer program; and compiling a hardware simulator computer program to produce the hardware simulator, wherein the step of compiling the hardware simulator computer program includes accessing the shared library of functions to retrieve object code corresponding to the at least one of the plurality of predefined verification system functions invoked by the master model computer program.

18. The method of claim 17, wherein the first programming language is not the same as the second programming language.

19. The method of claim 18, wherein:

the at least one of the plurality of predefined verification system functions invoked by the test script computer program includes a first verification system function; and the at least one of the plurality of predefined verification system functions invoked by the master model computer program includes the first verification system function.

20. A method for making test script means and a master model, each for use in a hardware design verification system comprising: simulator means for simulating a hardware environment having a circuit under test coupled to the master model; the test script means for executing a test script; dispatch means; first inter-task communication means for transmitting a packet from the test script means to the dispatch means; and second inter-task communication means for transmitting a packet from the dispatch means to the simulator means, wherein: the test script means uses the first inter-task communication means to transmit a first packet to the dispatch means, the first packet being encoded in accordance with a predetermined encryption technique and designating a desired manipulation of the simulated hardware environment; the dispatch means, in response to receipt of the first packet, uses the second inter-task communication means to transmit the first packet to the master model; and the master model, in response to receipt of the first packet, decodes the first packet in accordance with the predetermined encryption technique and manipulates the hardware environment in accordance with the desired manipulation, the method comprising the steps of:

using a first programming language to generate a test script computer program comprising invocations of at least one of a plurality of predefined verification system functions;

using a second programming language to generate a master model computer program comprising invocations of at least one of the plurality of predefined verification system functions;

compiling the test script computer program to produce the test script, wherein the step of compiling the test script computer program includes accessing a shared library of functions to retrieve object code corresponding to the at least one of the plurality of predefined verification system functions invoked by the test script computer program; and compiling the master model computer program to produce the master model, wherein the step of compiling the master model computer program includes accessing the shared library of functions to retrieve object code corresponding to the at least one of the plurality of predefined verification system functions invoked by the master model computer program.

21. The method of claim 20, wherein the first programming language is not the same as the second programming language.

22. The method of claim 21, wherein:

the at least one of the plurality of predefined verification system functions invoked by the test program computer program includes a first verification system function; and the at least one of the plurality of predefined verification system functions invoked by the master model computer program includes the first verification system function.

\* \* \* \* \*